United States Patent [19]

Onishi et al.

[11] Patent Number: 5,232,901

[45] Date of Patent: * Aug. 3, 1993

[54] METHOD OF PRODUCING SUPERCONDUCTING CERAMIC WIRE HAVING PROTECTIVE METAL COATING THEREON

[75] Inventors: Masashi Onishi; Takashi Kohgo; Yoshiki Chigusa; Minoru Watanabe, all of Yokohama, Japan

[73] Assignee: Sumitomo Electric Industries, Inc., Osaka, Japan

[*] Notice: The portion of the term of this patent subsequent to Dec. 4, 2007 has been disclaimed.

[21] Appl. No.: 665,656

[22] Filed: Mar. 7, 1991

[30] Foreign Application Priority Data

Mar. 8, 1990 [JP] Japan .................. 2-57344

[51] Int. Cl.⁵ .................. B05D 1/18; C03B 37/00
[52] U.S. Cl. .................. 505/1; 505/704; 505/733; 505/740; 505/742; 427/62; 427/443.2; 427/117; 65/2; 65/33
[58] Field of Search ............ 505/1, 704, 733, 740, 505/742; 427/62, 63, 117, 443.2; 65/2, 33

[56] References Cited

U.S. PATENT DOCUMENTS

| 4,975,416 | 12/1990 | Onishi et al. | 505/1 |
| 5,010,053 | 4/1991 | Maroni | 505/1 |

FOREIGN PATENT DOCUMENTS

| 0285168 | 10/1988 | European Pat. Off. | |
| 0292125 | 11/1988 | European Pat. Off. | |
| 0305949 | 3/1989 | European Pat. Off. | |
| 0306034 | 3/1989 | European Pat. Off. | |
| 64-12427 | 1/1989 | Japan | 505/704 |
| 1-134819 | 5/1989 | Japan | |

OTHER PUBLICATIONS

Zheng et al., "Bi₄Ca₃Sr₃Cu₄Oy ceramic fibers from crystallization of glasses", Appl. Phys. lett. 55(12) Sep. 1989 pp. 1255-1257.

Japanese Journal of Applied Physics, vol. 27, No. 12, Dec. 1988, pp. 2293-2295, Tokyo, JP; T. Komatsu et al.: "Preparation of High-$T_c$ Superconducting Bi-Pb-Sr-Ca-Cu-O Ceramics by the Melt Quenching Method".

Physica C Superconductivity, vol. 161, No. 1, Oct. 1989, pp. 71-75; W. Gao et al.: "Synthesis of Bi-Pb-Sr-Ca-Cu oxide/silver superconducting microcomposites by oxidation of metallic precursors".

Japanese Journal of Applied Physics, Supplements, vol. 28, No. 12, Dec. 1989, pp. 2204-2206, Tokyo, JP; M. Onishi et al.: "Preparation of $Bi_{1.5}SrCaCu_2O_x$ glass fibers using melt-quenched glasses".

Solid State Communications, vol. 72, No. 1, 1989, pp. 113-116; A. Rojek et al.: "115 K Superconductivity in Bi-Pb-(Ag,Nb,Sb)-Sr-Ca-Cu-O Systems".

Primary Examiner—Roy King
Attorney, Agent, or Firm—Stevens, Davis, Miller & Mosher

[57] ABSTRACT

There is provided a method of producing a protective metal coated or covered superconducting ceramic wire by applying a finely pulverized protective metal-dispersed polymeric resin onto the surface of a glass wire in amorphous state of metal oxides capable of being converted into superconductive ceramic, heating the wire to remove the polymeric resin therefrom to obtain the wire having a metal powder coating thereon, and heat-treating the wire to become superconductive. The coating is easily conducted without damaging the excellent productivity of the so-called melt-quenching and preform wire-drawing process for producing a superconducting ceramic wire.

13 Claims, 2 Drawing Sheets

FIG. 1A
FIG. 1B
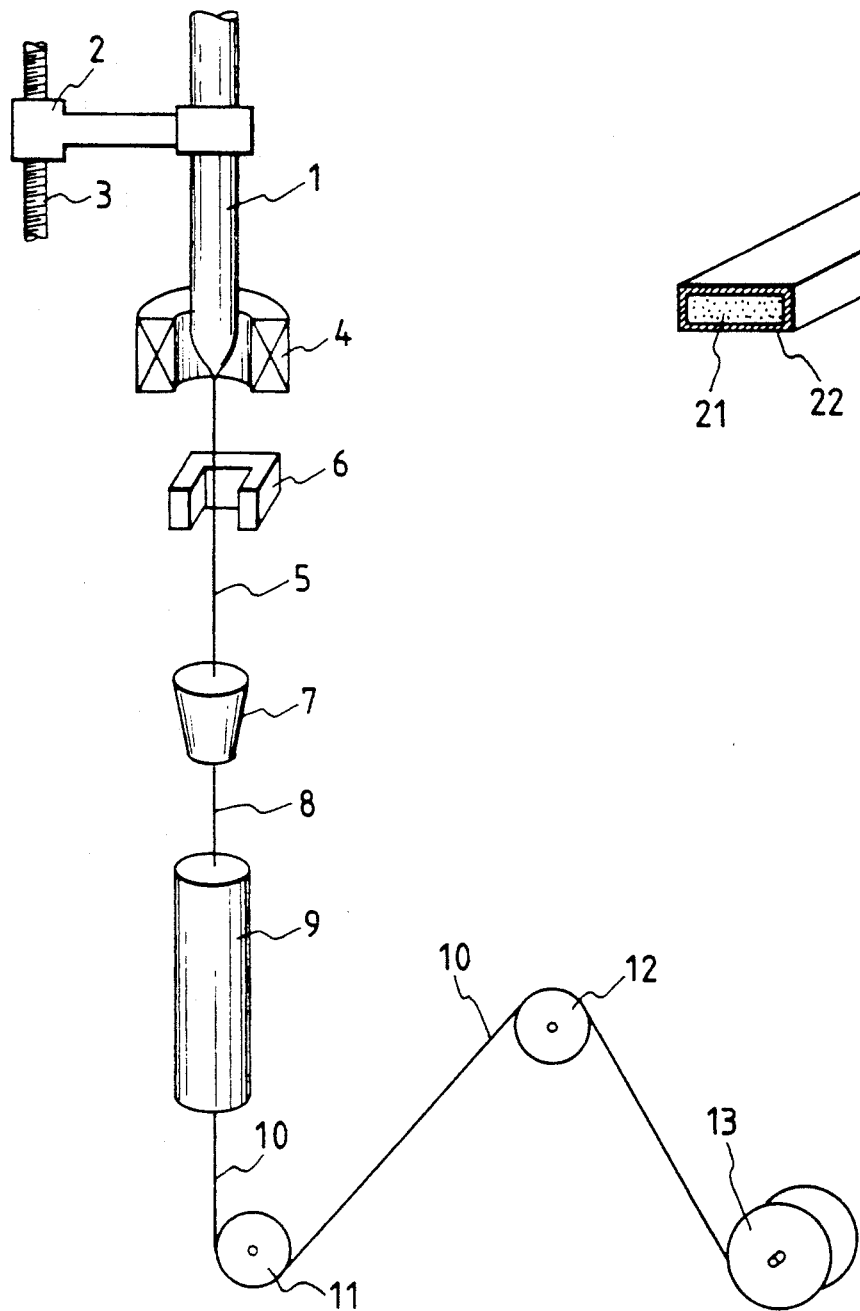
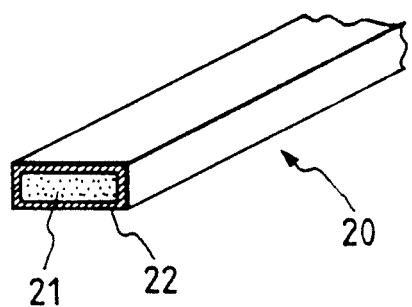

METHOD OF PRODUCING SUPERCONDUCTING CERAMIC WIRE HAVING PROTECTIVE METAL COATING THEREON

BACKGROUND OF THE INVENTION

1. Field of the Invention

The present invention relates to a method of producing a superconducting wire, and more particularly it relates to a method of producing a superconducting ceramic wire having a protective metal coating thereon.

2. Related Background Art

A metal oxide ceramic superconducting wire has poor flexibility and is susceptible to quality degradation. A protective metal coating or covering has often been made on the surface of such superconducting ceramic wire.

Japanese Patent Application Publication No. 134819 (Sedaka et al) and European Patent Application Publication No. 285169 (Nakai et al) disclose the covering during so-called melt-drawing method including annealing step to crystallize the drawn wire in one process. The former deals with Y-Er-Ba-Cu-O ceramic system, and a coating is effected after annealing step. The latter discloses the covering of a variety of ceramic systems including Y-Ba-Cu-O and Bi-Sr-Ca-Cu-O systems, and the covering is effected by leading the melt into a platinum pipe acting as a support.

U.S. Pat. No. 4,975,416 (to Onishi et al) corresponding to European Patent Application No. 369464 which is incorporated herein by reference discloses a method of producing a superconducting ceramic wire of various systems including Bi-Sr-Ca-Cu-O, Bi-Pb-Sr-Ca-Cu-O, Tl-Ba-Ca-Cu-O and Tl-Bi-Sr-Ca-Cu-O systems, which is called now melt-quenching and preform wire-drawing process in which the starting oxide mixture is molten, quenched to a glass in amorphous state, a preform made of the glass is wire-drawn with keeping amorphous state to a such extremely thin wire as 100 $\mu$m or less and the wire is subjected to heat-treatment to give superconductivity. According to the reference method, a superconducting ceramic thin wire having higher flexibility and better superconducting properties than those obtained by the above other methods can be realized with excellent productivity. The method with its characterization or identification is also published as articles in a Japanese journal by reporters including some of the present inventors. (Japanese Journal of Applied Physics, Vol., 28, No. 12, Dec. 1989; and Vol. 29, No. 1, Jan., 1990, which are also incorporated herein by reference).

The reference U.S. Pat. No. 4,975,416 also discloses a metal (e.g. Ag)-protecting cover of the resulting superconducting wire. According to the Patent, a wire which is super conductive is coated or covered with metal by sandwiching between metal plates, inserting in a metal pipe, dipping into a molten metal or winding a metal tape.

All the covering or coating methods disclosed in the above references are incomplete, expensive, difficult, troublesome or liable to degrade the property of wire covered.

The significance of the covering is not only to improve the poor flexibility of the superconducting wire obtained by the melt-quenching process so as not to be damaged by a slight strain, but also to improve its property.

The following drawbacks of the superconducting wire obtained by the melt-quenching method are not improved or resolved. They are:

1) The wire is so brittle that a pressure sufficient to enhance the critical current density due to the crystal orientation is differently applied.

2) A superconducting state of the superconductor fiber is partially disturbed under the influence of ambient turbulence such as in magnetic field or mechanical strain when a current flows through the fiber. Joule heat is generated by such a portion of the fiber. Since the conventional fiber has a poor heat dissipation property, the temperature of the fiber as a whole is increased to disturb the superconducting state of the entire superconducting state.

3) Some elements of the oxide superconductor material are evaporated during a heat treatment for precipitating a superconductor crystal phase. Therefore, desired properties of the superconducting fiber cannot be obtained.

It is expected that problems (1) to (3) can be overcome by forming a protective metal coating layer of, e.g., Ag on the surface of the superconducting fiber. A practical technique for coating Ag on a fiber manufactured by the prior-art method can be a plating method or a dipping method of dipping a fiber into an Ag melt. The plating method results in poor productivity. In the dipping method, the temperature of the Ag melt reaches 961° C. It is impossible to dip a superconducting fiber in the Ag melt because the superconducting fiber is softened at 400° to 500° C.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

SUMMARY OF THE INVENTION

The object of the present invention is to provide a simple and inexpensive metal-covering or coating method.

According to the invention, there is provided a method of producing a protective metal coated or covered superconducting ceramic wire which comprises applying a finely pulverized protective metal-dispersed polymeric resin onto the surface of a glass wire in amorphous state which consists essentially of metal oxides capable of being converted into superconductive ceramic, heating the wire to remove the polymeric resin therefrom to obtain the wire having a metal powder coating thereon, and heat-treating the wire to become superconductive.

BRIEF DESCRIPTION OF THE DRAWINGS

FIG. 1A is a view showing an apparatus for realizing a method of manufacturing a superconducting fiber according to an embodiment of the present invention; and FIG. 1B is a partially sectional view of a superconducting fiber obtained by the apparatus shown in FIG. 1A;

DESCRIPTION OF PREFERRED EMBODIMENT

Figure 2A:
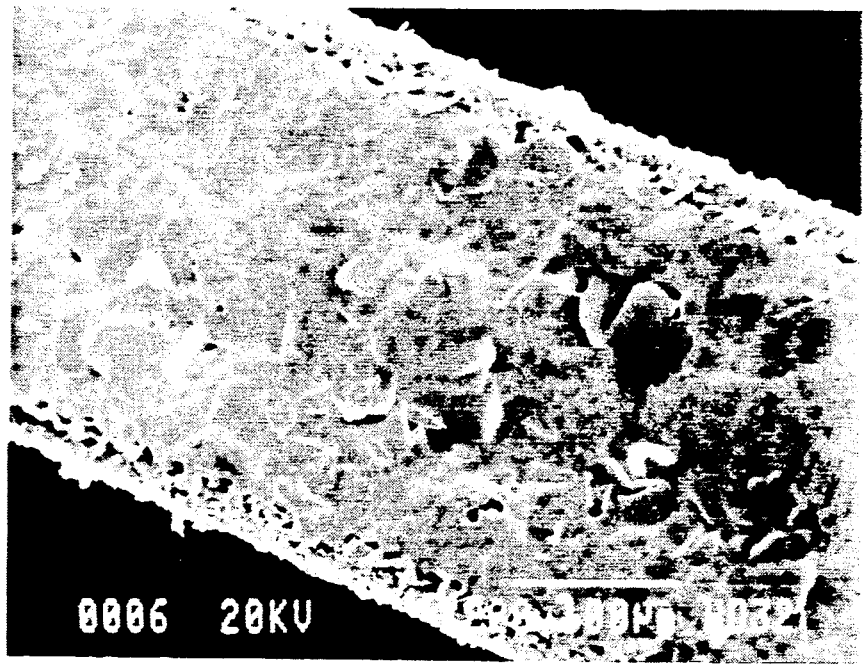
FIG. 2A is an electron micrograph showing a glass wire obtained by a method according to the present invention.

A feature of the present invention is that a coating is effected with respect to a glass wire in amorphous state. The glass wire is so thin and flexible that it can be wound onto a mandrel of 10 mm diameter, and has almost quantitative density and smooth surface. These demonstrate possibility of giving good coatings by easy processing.

Other feature is that fine metal powder or foil-dispersed polymeric resin, which is removable as vapor or decomposed gas from the coatings by heating, is used for coating the glass wire.

Another feature is that the heat-treatment for giving superconductivity is conducted to the glass wire having a metal powder coating on the surface.

Any ceramic compositions of the glass wire may be used as far as the glass wire is in amorphous state. The systems disclosed in the references previously mentioned may be employed in the invention. More particularly, the above mentioned system Bi-Sr-Cu-Ca-O which may be doped with Pb and/or Ag, and the Tl-Ba-Ca-Cu-O and Tl-Bi-Sr-Ca-Cu-O system are usable as disclosed in the U.S. Pat. No. 4,975,416. Further the Bi-system doped with Nb and/or Sb can be converted to the amprphous state as disclosed in Solid State Communications, Vol. 72, No. 1, pp. 113-116(Rojek et al), 1989 and may be also used in the present invention.

The glass wire may also be made by any method, and the melt-drawing method disclosed in the Japanese Patent Application Publication No. 134819/1989 would enable to prepare the glass wire if an appropriate device for supercooling the melt-drawn fiber were provided. Zheng et al (App. Phys. Lett. Vol. 55, No.12, Sep.18, 1989, pp. 1255-1257) incorporated herein by reference report amorphous glass fibers of Bi-Ca-Sr-Cu-O system prepared by melt-spinning, which are then heat-treated to obtain dense superconducting fibers. At present time, the so-called melt-quenching and preform wire-drawing method as disclosed in the U.S. Pat. No. 4,975,416 is believed to be best.

According to the present invention, the glass wire is coated with a protective layer of metal powders, such as those of Ag, Au, Pt, Cu, Ni, or alloys there of among which Ag is most preferable.

The coating is carried out by applying a polymeric resin dispersed with the finely pulverized metal powders or foils onto the glass wire surface, followed by drying or hardening the applied surface. The application method is in any ways such as brushing, immersing or spraying. The metal dispersed resin is preferably in the form of a thermo or photo- hardening varnish or paste. The resin used is thermo plastic type which can be vaporized or decomposed completely by heating at a temperature below the glass transition temperature of the wire. Though there may be used any thermo plastic resins such as polyacrylic acid, polyacrylate, polyvinyl alcohol, polyvinyl butyral etc. as far as the above restriction is satisfied, a polyacrylic resin is herein mentioned as an example. The coating including the application and hardening is preferably repeated several times to give a thick resin layer onto whole surface of the wire, since the resulting metal coating apts to contract due to subsequent resin removing step by heating.

On the contrary to a superconducting wire which has already been in polycrystalline state, a glass wire which is dense and has a smooth surface is well coated with metal powder layer according to the invention. If the superconducting wire is used in the present process, the varnish permeates into the wire, resulting in the damage of the wire texture by gas foams evolved during the removal of the varnish components.

The step of removal of the polymeric resin and varnish components from the resin coated and hardened wire is carried out by heating at temperature below the glass transition, and preferably below the crystallization temperature of the wire, leaving a coating of the metal powders. In case of Bi-systems the temperature is preferably up to 400° C. Higher temperature may be used, but cause deterioration of superconductivity due to the reaction with gas components.

The heat-treatment to make the thus formed metal coated wire superconductive may preferably be carried out according to the method disclosed in the U.S. Pat. No. 4,975,416 or the European Patent Application Publication No. 369464, which has been incorporated herein by reference as above. Thus, the wire is kept at a crystal-growing temperature for a considerable time. Before the above heat-treatment, the wire may be subjected to preheat-treatment which forms crystal nuclei. Though the both temperatures will be different depending upon the materials of the wire, the former is about 800° C. to about 870° C. and the latter is about 420° C. to about 430° C. for Bi-Sr-Ca-Cu-O system with or without being doped with Pb or others. Thus obtained metal powder-coated superconducting ceramic wire can be subjected to an additional heat-treatment to improve its critical current density, as disclosed in the U.S. Pat. No. 4,975,416. The heat-treatment is carried out in same way as above before, during or after application of pressure to cause enhancement of the orientation of crystals to longitudal direction. Though the metal powder coating is most desirable to cover whole surface of the resulting superconducting wire with continuous layer, it is permitted according to the present invention to cover a major part of the surface with a metal powder layer having a minor gap, as far as the protection of wire is substantially achieved.

The step of coating onto glass wire can be incorporated in the melt-quenching and preform wire-drawing process and effected without damaging the excellent productivity which is the most important characteristic of the process. That is, the resin or varnish can continuously be applied on-line basis onto a very fine, solid glass wire which has been continuously wire-drawn from a preform, as is done in resin coating of optical fibers.

The protective metal powder or foil coated superconducting wire obtained according to the present invention has an improved flexibility and can eliminate the above drawbacks of the superconducting wire itself prepared by the corresponding method. Thus, due to the pressing to improve the critical current density (Jc), the dissipation of Joule heat through the metal coating having a high thermal conductivity and the suppression of evaporation of metal constituent become effective.

The present invention will be explained more concretely by referring to Drawings and Examples as well as Comparative Examples, but they should not be construed to limit the present invention thereto only.

A preform 1 of a ceramic glass prepared by the melt-quenching method is set in an arm 2 in FIG. 1A. The arm 2 is connected to a preform driver 3 so that the preform can be vertically driven by the driver 3. A heater 4 is arranged to surround the distal end portion of the preform 1, and heats and softens the preform 1 to draw a glass wire 5 with keeping amorphous state. The size of the drawn glass wire 5 is measured by a diameter gauge 6, and the glass wire 5 is supplied to a die 7. A polymeric resin varnish dispersing a finely pulverized protective Ag is supplied to the die 7, so that the resin is uniformly applied on to the surface of glass wire 5. A varnish-coated glass wire 8 passes through a varnish hardening furnace 9. A glass wire 10 with the hardened varnish is taken up by a winder 13 through capstans 11 and 12.

The glass wire 10 with the hardened varnish, which is wound around the winder 13 is placed in an electric furnace (not shown) and is heated at a temperature below the crystallization temperature of the glass wire 5 to remove the varnish component of the coating layer by evaporation or decomposition. Only Ag is left on the surface of the glass wire, thereby obtaining an Ag-glass wire. In this case, coating by means of the die 7 and varnish removal in the electric furnace may be repeated again. The resultant wire is heat-treated to form the superconducting crystal phase, thereby obtaining a superconducting wire 20 shown in FIG. 1B. As shown in FIG. 1B, the superconducting wire 20 comprises a superconductor portion 21 containing the superconducting crystal phase and a coating portion 22 of Ag powder layer.

EXAMPLE 1

Materials were mixed in a composition of $Bi_{1.6}Pb_{0.4}Sr_2Ca_2Cu_3O$ and were pre-sintered at 800° C. for 12 hours. The presintered body was pulverized again to obtain a powder mixture, and the powder mixture was placed in a platinum melting pot and melted in an electric furnace at 1,300° C. for 20 minutes. The melt was removed from the electric furnace and poured and quenched on an iron plate, thereby preparing a glass in amorphous state. This glass was cut to form a plate preform with an end heated and which was softened at about 450° C. The softened preform was wire-drawn to obtain a glass wire having a width of 1.5 mm and a thickness of 100 μm. A varnish paste obtained by dispersing Ag in an acrylic resin was applied to the glass wire, and the glass wire was passed through a heating furnace at 100° C. to harden the varnish. The glass wire coated with a resin layer dispersing Ag was heated in an electric furnace at 300° C. for 12 hours to evaporate the resin component. The wire having Ag layer on its surface was superconducting wire. Brittleness of the wire was improved, and the wire was not broken even at a bending stress of 0.5%. Electrical characteristics of the resultant wire were measured by a known four-terminal method. A critical temperature $T_C$ and a critical current density $J_C$ were as follows:

$T_C = 109$ K.
$J_C = 850$ A/cm² at 77 K, zero magnetic field.

EXAMPLE 2

A glass wire was prepared according to the procedure of Example 1. The wire was coated by dipping in a Ag powder dispersed acrylic resin paste at room temperature, dried at about 100° C. and heated at 300° C. for about 12 hours to vaporize the paste components.

An electron micrograph of the thus resulting glass wire having substantially Ag powder layer on the surface is shown in FIG. 2A.

The glass wire heat-treated by heating at 840° C. for 100 hours. After cooling to room temperature, the wire was pressed at the pressure of 400 kg/cm² to cause the orientation of crystals, and then heat-treated again by heating at 840° C. for 100 hours. The critical current density (Jc) was 2000 A/cm² at 77 k.

Figure 2B:
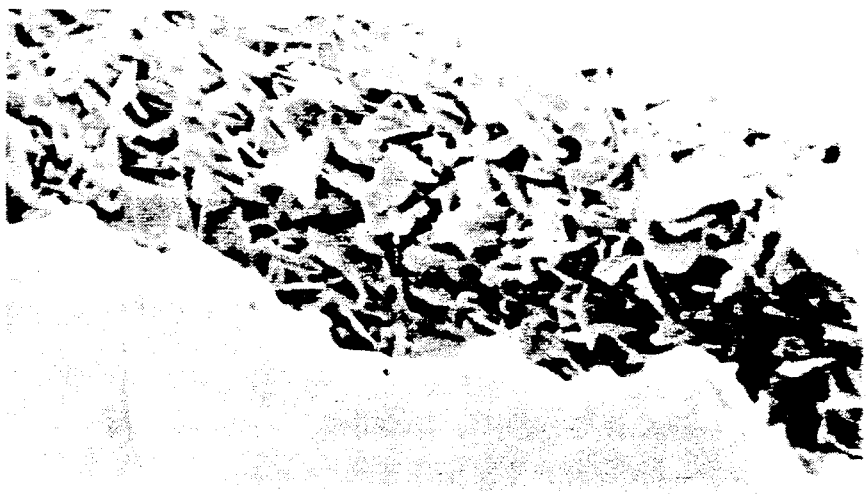
FIG. 2B is an electron micrograph showing a glass wire obtained by a method accrding to the present invention.

An electron micrograph of the thus obtained superconducting wire having Ag powder layer on the surface is shown in FIG. 2B.

COMPARATIVE EXAMPLE 1 surface is shown in FIG. 2B.

COMPARATIVE EXAMPLE 1

A superconducting wire was prepared without an Ag coating, following the same procedures as in Example 1. The resultant wire was brittle and broken at a small bending stress of 0.1%. The characteristics of the fiber measured by the known four-terminal method were as follows:

$T_C = 50$ K.
$J_C = 2$ A/cm² at 30 K, zero magnetic field.

The composition of the resultant wire was analyzed by the ICP method. Pb was perfectly evaporated from the wire.

COMPARATIVE EXAMPLE 2

A glass wire having no coating prepared following the same procedures as in Example 1 was heat-treated to convert into a superconductor material at 423° C. for 4 hours and 840° C. for 100 hours. An Ag-containing resin was coated on the wire, following the same procedures as in Example 1. The resin component was evaporated, and another heat treatment was performed at 840° C. for 100 hours. The resultant wire was porous and did not exhibit superconducting properties in all temperature ranges.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A method of producing a protective metal coated oxide superconducting wire which comprises applying a finely pulverized protective metal powder-dispersed polymeric resin onto the surface of a glass wire in amorphous state, the metal of the metal powder being selected from the group consisting of Ag, Au, Pt, Cu, Ni and alloys thereof, heating the wire to remove the polymeric resin therefrom to obtain the glass wire having a metal powder coating thereon and heating the wire to become superconductive, the glass wire being prepared by a method of melting a mixture which consists essentially of metal oxides capable of being converted into superconductive ceramic, quenching the melt to form a glass, making a preform of the glass and wire-drawing the preform while maintaining an amorphous state thereof.

2. A method of producing a protective metal coated oxide superconducting wire according to claim 1, wherein the protective metal is Ag.

3. A method of producing a protective metal coated oxide superconducting wire according to claim 1, wherein the heating of the wire to remove the polymeric resin therefrom is effected at a temperature below the glass transition temperature of the glass wire.

4. A method of producing a protective metal coated oxide superconducting wire according to claim 1, wherein the heating of the wire to remove the polymeric resin therefrom is effected at a temperature below the crystallization temperature of the glass wire.

5. A method of producing a protective metal coated oxide superconducting wire according to claim 1, wherein before the heating of the wire to remove the polymeric resin therefrom the applied resin is hardened or dried.

6. A method of producing a protective metal coated oxide superconducting wire according to claim 1, wherein the glass wire is 100 μm or less in thickness.

7. A method of producing a protective metal coated oxide superconducting wire according to claim 1, wherein the protective metal powder-dispersed resin is a thermoplastic resin in the form of a thermo or photodrying paste or varnish.

8. A method of producing a protective metal coated oxide superconducting wire according to claim 1, wherein the glass is a Bi-Ca-Sr-Cu-O system, Bi-Ca-Sr-Cu-O system doped with Pb, Ag, Ni, Sb or any mixture thereof, Tl-Ba-Ca-Cu-O system or Tl-Bi-Sr-Ca-Cu-O system.

9. A method of producing a protective metal coated oxide superconducting wire according to claim 1, wherein the glass is a Bi-Ca-Sr-Cu-O system doped with Pb, Ag, Ni, Sb or any mixture thereof.

10. A method of producing a protective metal coated oxide superconducting wire according to claim 1, wherein the polymeric resin is a polyacrylic acid, polyacrylate, polyvinyl alcohol or polyvinyl butyral.

11. A method of producing protective metal coated oxide superconducting wire according to claim 1, wherein the applying of the resin is repeated several times.

12. A method of producing a protective metal coated oxide superconducting wire according to claim 1, wherein a subsequent heat-treatment is effected before, during or after an application of pressure to the metal coated oxide superconducting wire to enhance the critical current density thereof.

13. A method of producing a protective metal coated oxide superconducting wire according to claim 1, wherein the polymeric resin is a polyacrylic acid.

* * * * *